(12) United States Patent
Binnard et al.

(10) Patent No.: US 6,551,045 B2
(45) Date of Patent: Apr. 22, 2003

(54) WAFER STAGE CHAMBER

(75) Inventors: Michael Binnard, Belmont, CA (US); Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/759,218

(22) Filed: Jan. 16, 2001

(65) Prior Publication Data

US 2002/0061243 A1 May 23, 2002

Related U.S. Application Data

(60) Provisional application No. 60/249,267, filed on Nov. 17, 2000.

(51) Int. Cl.[7] .............................................. G05D 19/00
(52) U.S. Cl. ......................... 414/217; 318/611; 310/12
(53) Field of Search ............................ 414/416.01, 217, 414/939, 940, 217.1, 416.08; 220/200; 429/163

(56) References Cited

U.S. PATENT DOCUMENTS

| 5,006,383 A | * | 4/1991 | Achille et al. ............ 220/62.11 |
| 5,060,990 A | * | 10/1991 | Smith et al. .................... 292/91 |
| 5,172,160 A | * | 12/1992 | Van Eijk et al. ............... 355/53 |
| 5,695,564 A | * | 12/1997 | Imahashi ..................... 118/719 |
| 5,782,517 A | * | 7/1998 | Mckee, , IV ............... 206/711 |
| 5,825,470 A | * | 10/1998 | Miyai et al. ................... 355/53 |
| 6,028,376 A | * | 2/2000 | Osanai et al. .................. 310/12 |
| 6,049,186 A | * | 4/2000 | Lee ............................. 318/611 |
| 6,059,567 A | * | 5/2000 | Bolten et al. .................. 432/81 |

* cited by examiner

Primary Examiner—Kathy Matecki
Assistant Examiner—Charles Fox
(74) Attorney, Agent, or Firm—Finnegan, Henderson, Farabow, Garrett & Dunner, L.L.P.

(57) ABSTRACT

A wafer stage chamber assembly is provided to isolate semiconductor substrates, a wafer stage device, and the process of making semiconductor wafers from the atmosphere so that the resulted wafers have an improved quality and meet certain wafer manufacturing specifications. The wafer stage chamber assembly includes a wafer stage chamber for sealing a wafer stage device from the atmosphere outside the wafer stage chamber, and at least one loader port for loading and unloading substrates into the wafer stage chamber. The wafer stage chamber is constructed of a chamber frame to enclose the wafer stage device, and a plurality of chamber walls including a front panel having the at least one loader port for loading and unloading a plurality of semiconductor substrates into the wafer stage chamber. The wafer stage chamber assembly also includes a top wall and a base frame. The chamber walls are layered with insulating materials, while the joint between the chamber frame with the top wall and base frame are sealed with sealing materials. The wafer stage chamber assembly is supported by an apparatus frame of an exposure device via a plurality of body supports.

23 Claims, 11 Drawing Sheets

WAFER STAGE CHAMBER

RELATED APPLICATION

This application relies on the benefit of priority of U.S. provisional patent application Serial No. 60/249,267, filed on Nov. 17, 2000.

BACKGROUND OF THE INVENTION

1. Field of the Invention

This invention relates to a wafer stage chamber design. More particularly, this invention relates to a wafer stage chamber assembly and method for making the wafer stage chamber assembly in a photolithography process to manufacture semiconductor wafers.

2. Description of the Related Art

In manufacturing integrated circuits using photolithography, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured coating is then removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

In a conventional exposure apparatus of a photolithography system, a wafer stage device is used in combination with a projection lens assembly to manufacture semiconductor wafers. The wafer stage device includes a wafer table to support the wafer substrates, a wafer stage to position the wafer substrates as the wafer stage is being accelerated by a force generated in response to a wafer manufacturing control system, and a wafer stage base to support the wafer stage. The wafer manufacturing control system is the central computerized control system executing the wafer manufacturing process. To permit smaller and more intricate circuit pattern, the projection lens assembly must accurately focus the energy beam to align the overlay of circuit patterns of the multi-layered integrated circuit. The photolithography process of the conventional exposure apparatus is performed with the semiconductor substrates exposed to the atmosphere.

Recent developments enabling the photolithography process to meet certain wafer manufacturing specifications and to improve the quality of the resulted wafers require that the semiconductor substrates be processed in a controlled atmosphere, such as nitrogen or helium. To take advantage of the recent developments, there is a need for a wafer stage chamber design to isolate the semiconductor substrates, the wafer stage device, and the manufacturing process thereof from the atmosphere.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, one aspect of the invention is a wafer stage chamber assembly for use in manufacturing semiconductor substrates, comprising a wafer stage chamber that seals a wafer stage device from the atmosphere outside the wafer stage chamber.

Another aspect of the present invention is a wafer stage chamber assembly for isolating a wafer stage device and used in a semiconductor wafer manufacturing system, comprising a chamber frame to enclose the wafer stage device, and a plurality of chamber walls including a front panel having at least one loader port for loading and unloading a plurality of semiconductor substrates into the wafer stage chamber.

A further aspect of the present invention is a method for making a wafer stage chamber assembly for use in manufacturing semiconductor substrates, comprising providing a wafer stage chamber for sealing a wafer stage device from the atmosphere, and providing at least one loader port for loading and unloading substrates into the wafer stage chamber.

Yet a further aspect of the present invention is a stage chamber assembly, comprising a stage chamber that seals at least one stage device from an external condition of a stage chamber, and at least one loader port connected to the stage chamber, the loader port allowing at least one of loading an object into the stage chamber and unloading the object out of the stage chamber.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Figure 1:
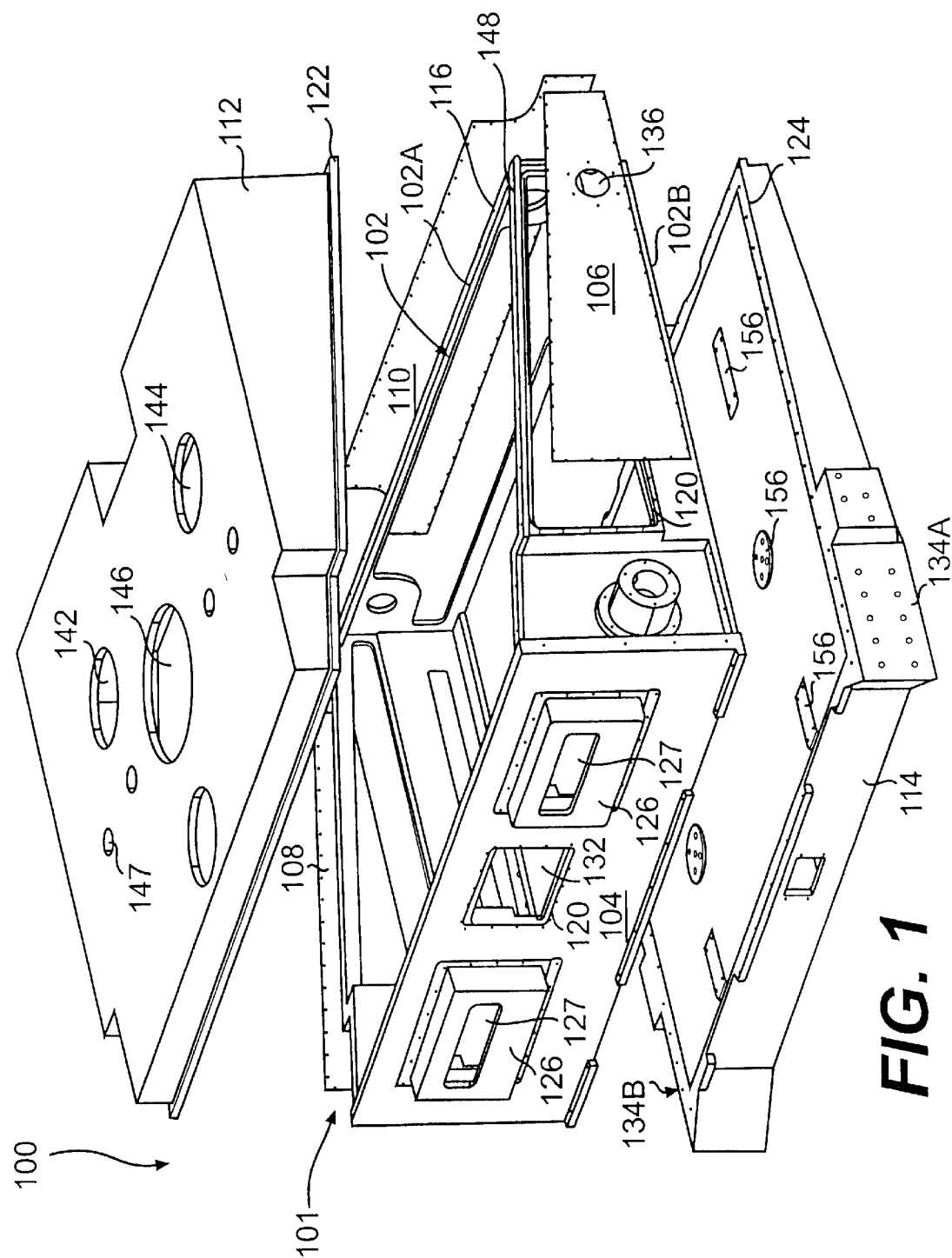
FIG. 1 is an exploded perspective frontal view of a wafer stage chamber assembly consistent with the principles of the present invention.
Figure 2:
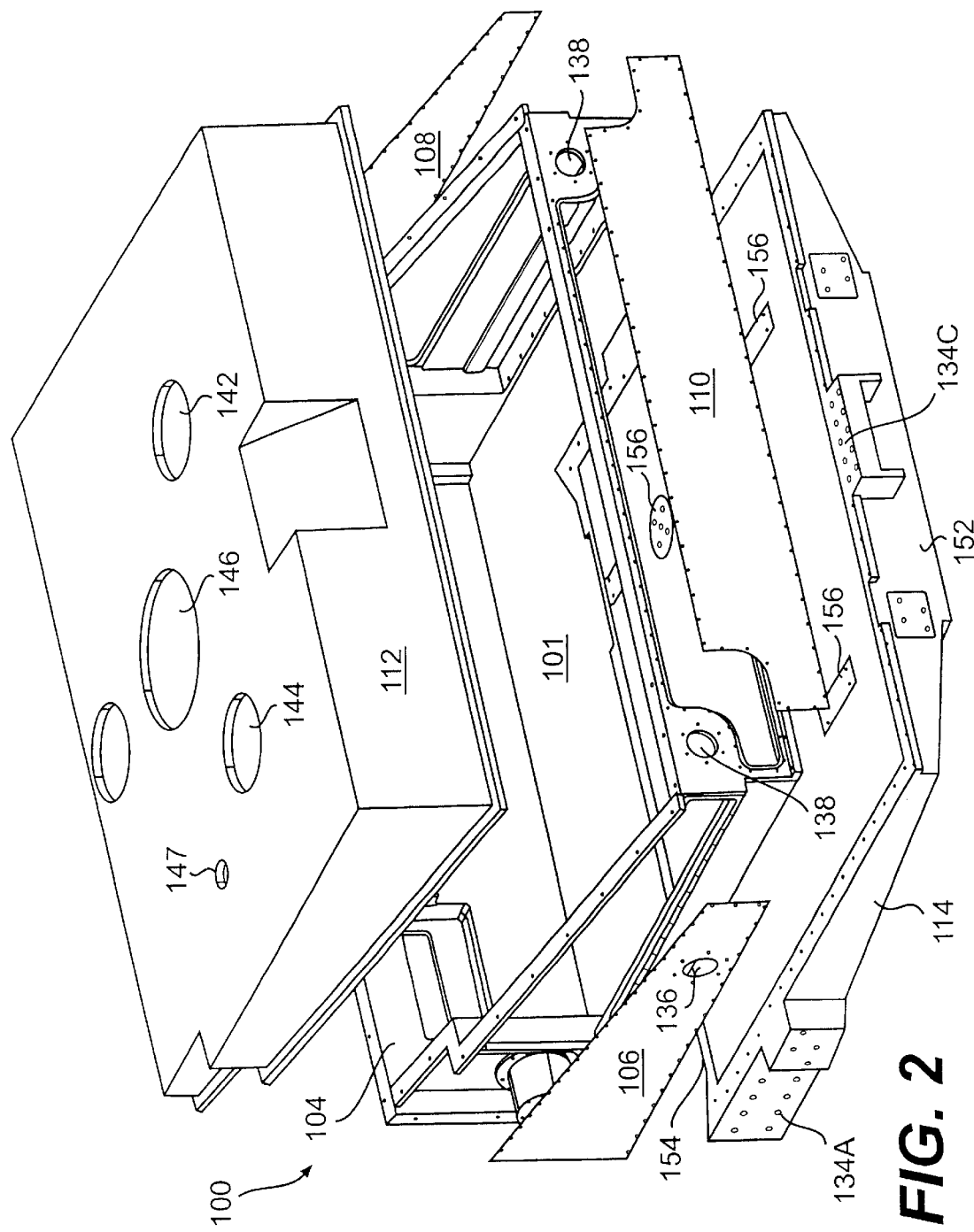
FIG. 2 is an exploded perspective rear view of the wafer stage chamber assembly shown in FIG. 1.
Figure 3:
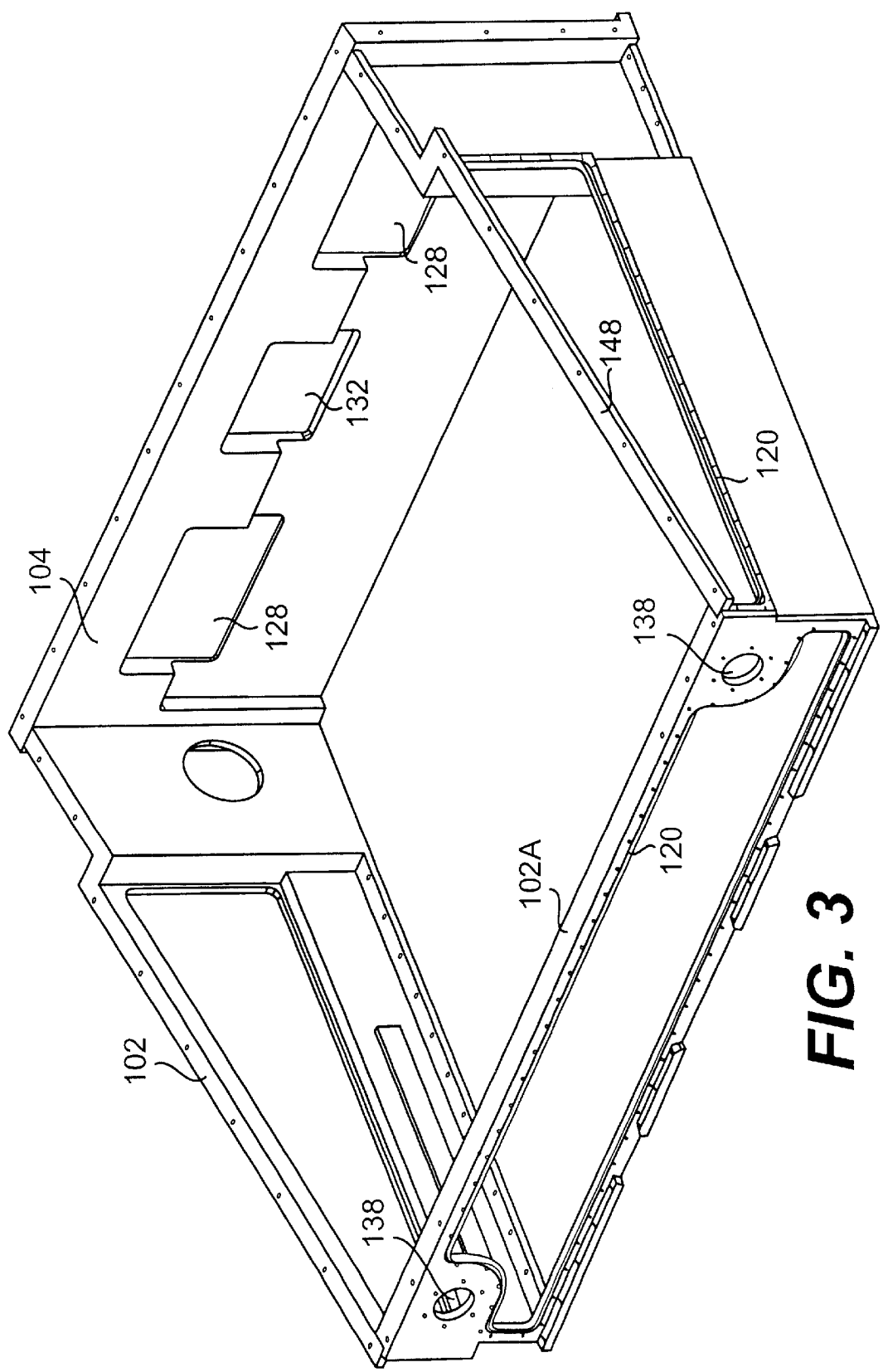
FIG. 3 is a perspective rear view of a wafer stage chamber frame consistent with the principles of the present invention.
Figure 4:
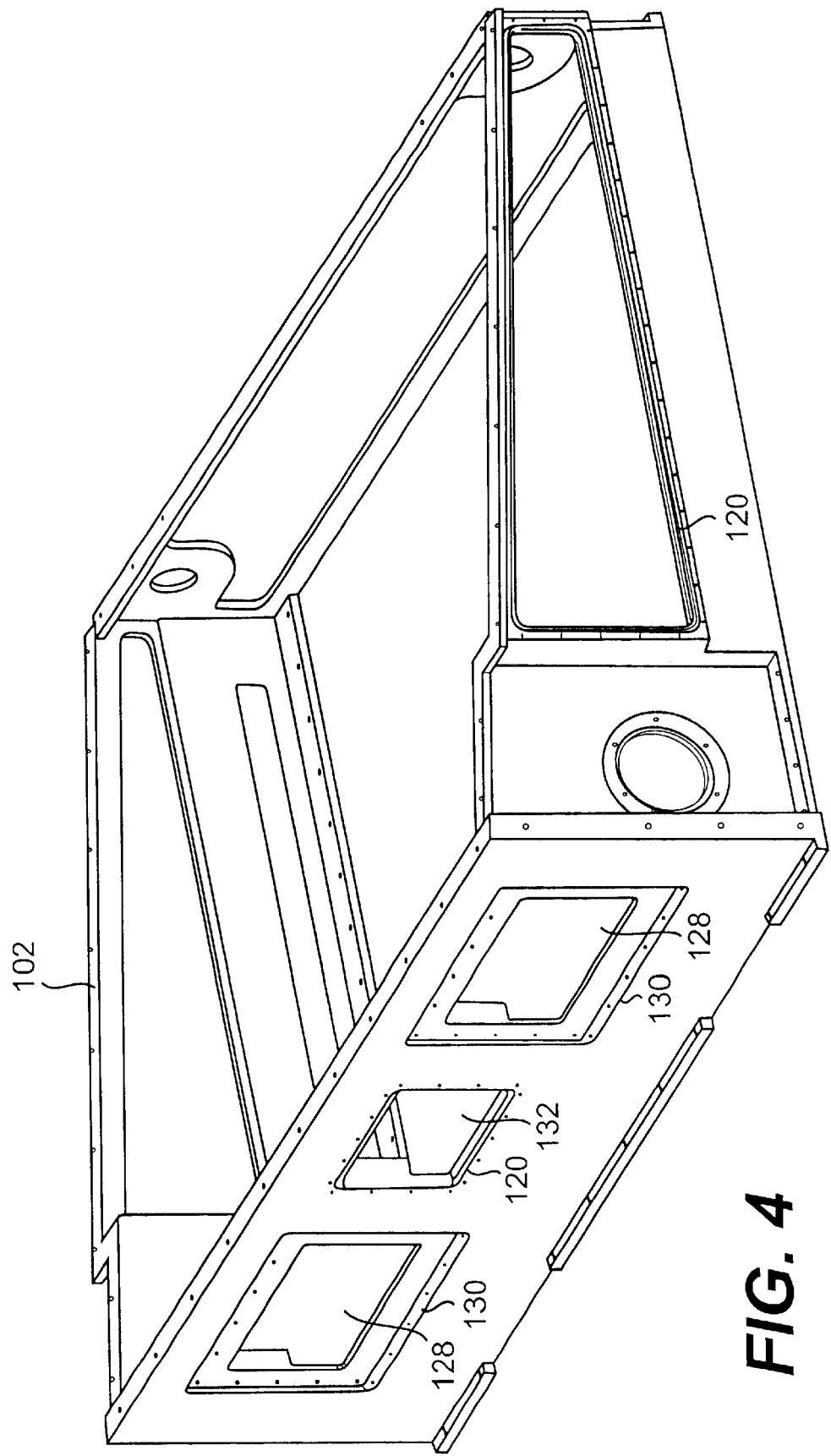
FIG. 4 is a perspective frontal view of the wafer stage chamber frame shown in FIG. 3.
Figure 5:
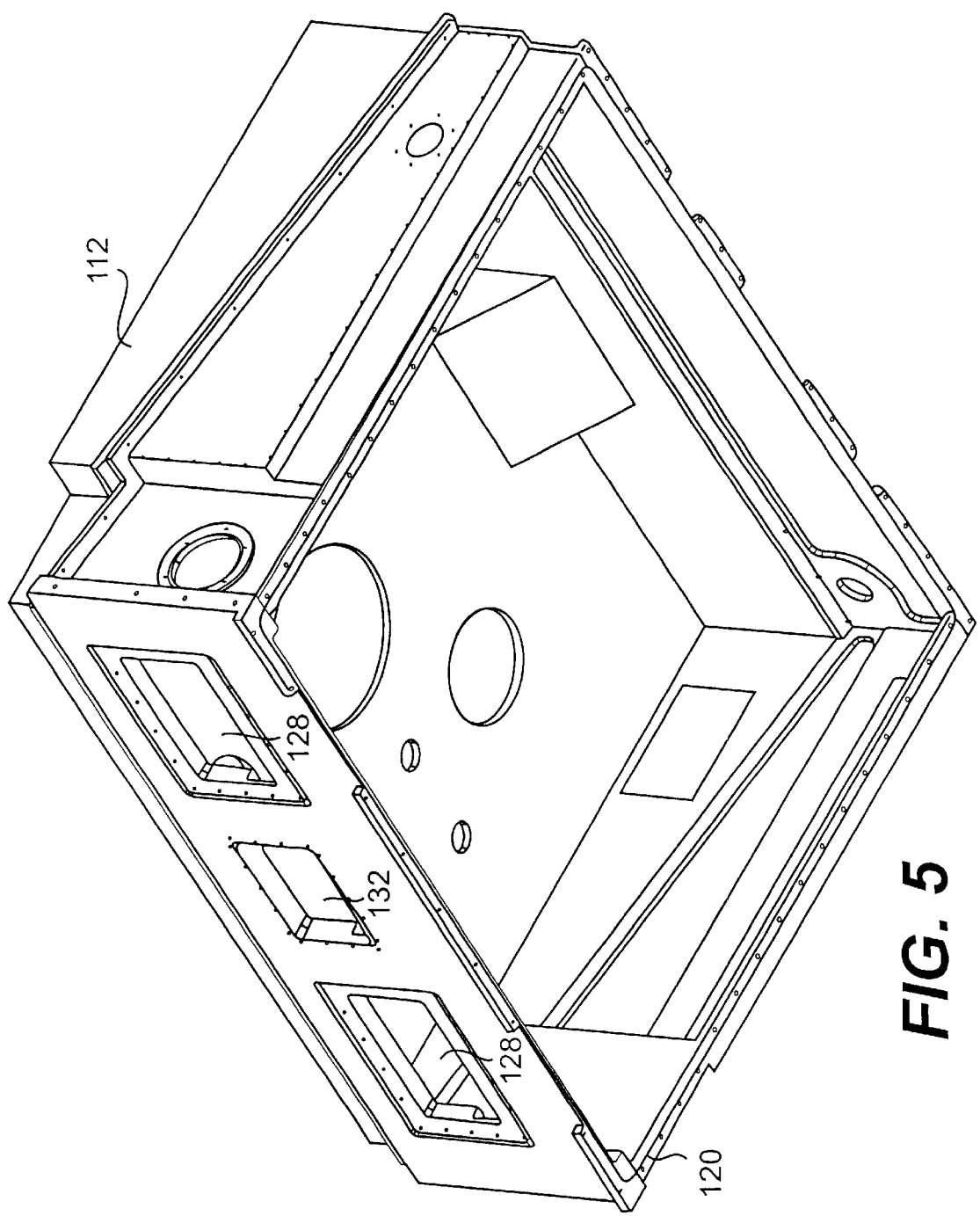
FIG. 5 is a perspective bottom view of the wafer stage chamber assembly consistent with the principles of the present invention.

Reference will now be made in detail to an embodiment of the apparatus, system, and method consistent with the principles of the present invention, examples of which are illustrated in the accompanying drawings. The invention will be further clarified by the following examples, which are intended to be exemplary of the invention.

The assembly and method consistent with the principles of the present invention are useful to isolate semiconductor substrates, the wafer stage device, and the process of making thereof from the atmosphere so that the resulted semiconductor wafers meet certain wafer manufacturing specifications and obtain the specified quality standards. The principles of this invention are similarly applicable to other parts of the photolithography system, such as a reticle stage device. Thus, this invention is not limited to any particular application. Rather, the assembly and method disclosed herein could be used in any system configured to embody similarly disclosed elements which require a chamber to isolate the sensitive and accurately aligned assembly or device therein.

Consistent with the principles of the present invention, and as illustrated in FIGS. 1–7, a wafer stage chamber assembly 100 for use in manufacturing semiconductor substrates comprises a wafer stage chamber 101 constructed of a chamber frame 102 to enclose a wafer stage device 66 (shown in FIG. 8), and a plurality of chamber walls or panels 104, 106, 108, and 110 attached to chamber frame 102. Wafer stage chamber assembly 100 also comprises a top wall 112 and a base frame 114 attached to the top and bottom sides, 102A and 102B, respectively, of the chamber frame 102.

Chamber frame 102 defines the shape of wafer stage chamber assembly 100, and may be made of steel plates and permanently fastened, such as by welding, to construct chamber frame 102. Chamber frame 102 has a plurality of threaded holes 116 for fastening the chamber walls thereto. To isolate the interior of wafer stage chamber assembly 100 from the external atmospheric condition, vibration, and other disturbances, chamber frame 102 is provided with a plurality of grooves 120 around the border where each of the chamber panels 104, 106, 108, or 110 is to be attached for receiving a sealing material. Similarly, top wall 112 has a first sealing flange 122 around the border to seal the engagement between top wall 112 and chamber frame 102. Likewise, base frame 114 has a second sealing surface 124 around the border to seal the engagement between base frame 114 and chamber frame 102. The sealing material may be a commercially available o-ring seal.

The plurality of chamber panels include a front panel 104, a pair of side panels 106 and 108, and a rear panel 110. Front panel 104 is a shear panel having sufficient stiffness to strengthen chamber frame 102. For example, in one embodiment, front shear panel 104 is made of stainless steel having a thickness of approximately 20 mm.

Front shear panel 104 has at least one loader port 126 (two are shown in FIG. 1). Each loader port 126 is provided with a loader window 127 to provide access for semiconductor substrates 68 (shown in FIG. 8) to go into and out of wafer chamber assembly 100. For each loader port 126, a corresponding loader opening 128 (best shown in FIG. 4) is provided on front shear panel 104.

Figure 6A:
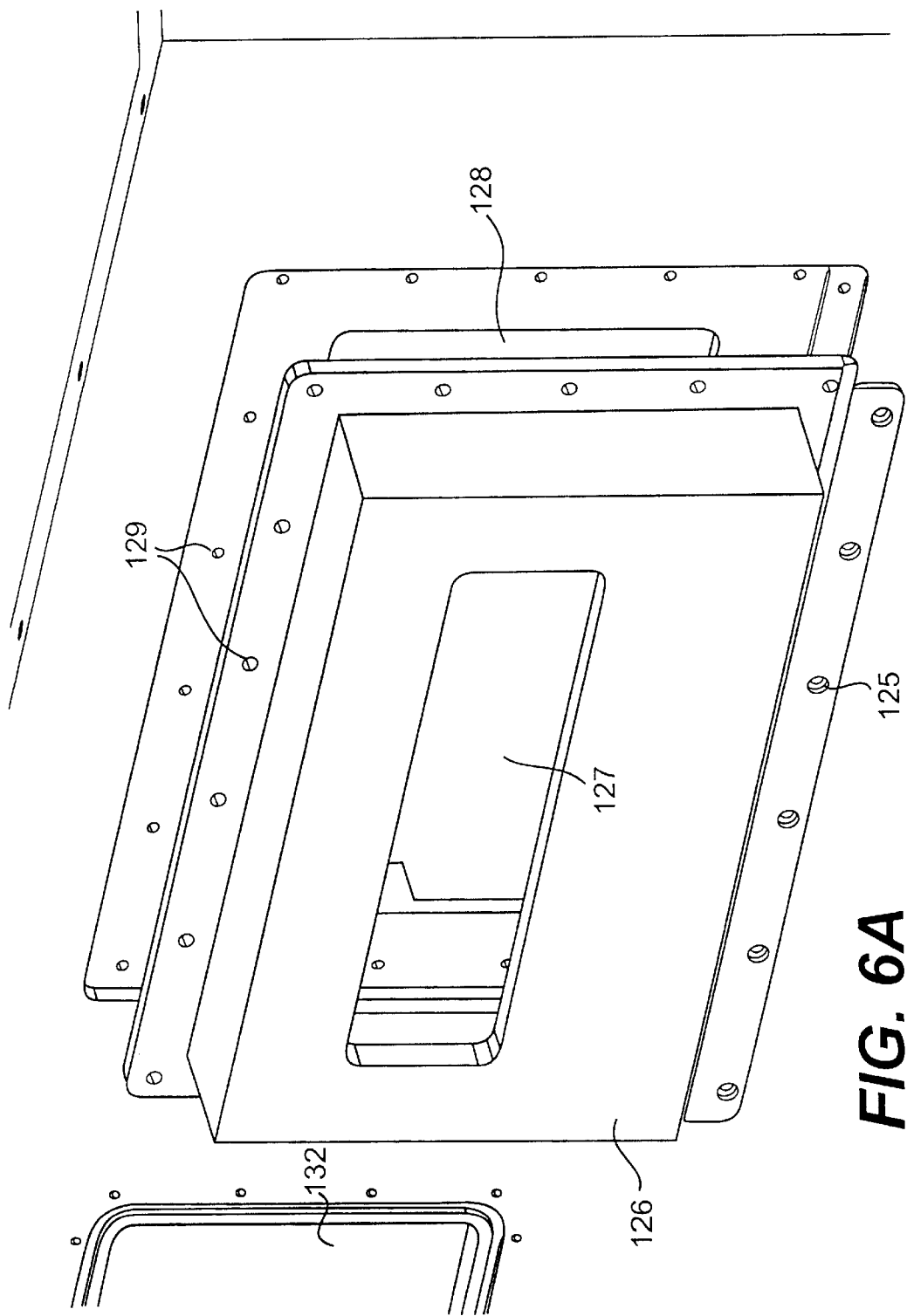
FIG. 6A is an exploded perspective view of a loader port of the wafer stage chamber assembly consistent with the principles of the present invention.

FIG. 6A illustrates an exploded perspective view of loader port 126. Each loader port 126 has a loader opening 128 for loading and unloading semiconductor wafers 68 into and out of wafer stage chamber assembly 100 for processing. Each loader port 126 may be fastened around loader opening 128 by using mechanical fasteners, for I example, screws, bolts, etc. Only a plurality of openings 129, which may be threaded, are shown to receive the mechanical fasteners. A seal (not shown), such as an o-ring seal, is provided on the perimeter of loader port 126 facing wafer stage chamber assembly 100 to seal the connection between each loader opening 128 and loader port 126. Each loader port 126 is also provided with a retainer strip 130 for securing a bottom edge 126A of loader port 126 to front shear panel 104. Each bottom edge 126A of loader port 126 may have an angled surface 126B, and each top edge 130A of retainer strip 130 has a corresponding angled surface to receive loader port 126. Thus, loader port 126 can be attached to wafer stage chamber assembly 100 by first fastening retainer strip 130 to front shear panel 104, i.e., using bolts inserted through countersunk bolt holes 125, then inserting bottom edge 126A of loader port 126 to retainer strip 130, and securing the other three edges of loader port 126 to front shear panel 104. An o-ring seal 123 may be provided on the back side of loader port 126 to seal the engagement between loader port 126 and front shear panel 104.

Figure 6B:
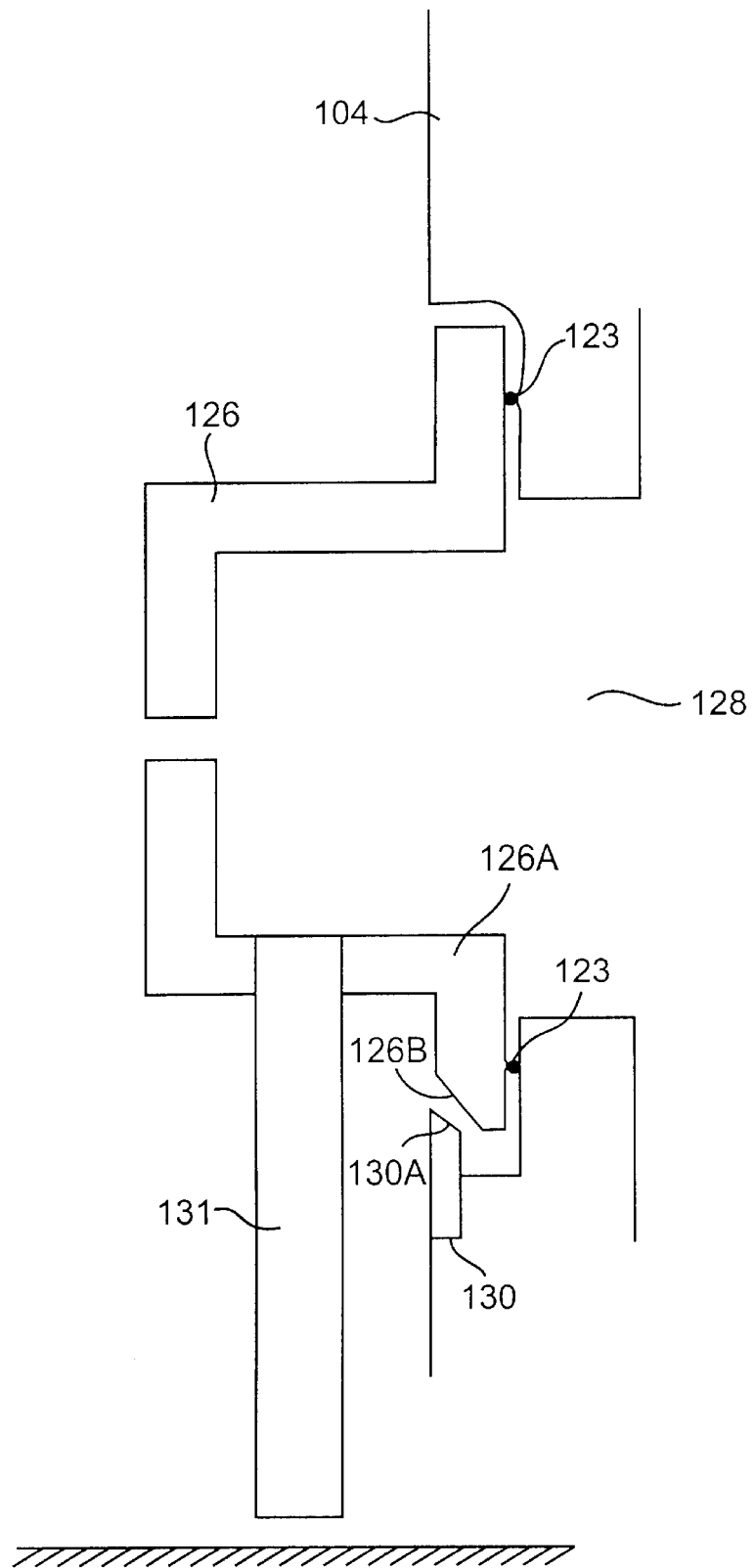
FIG. 6B is a partial section view of the loader port shown in FIG. 6A.
Figure 7:
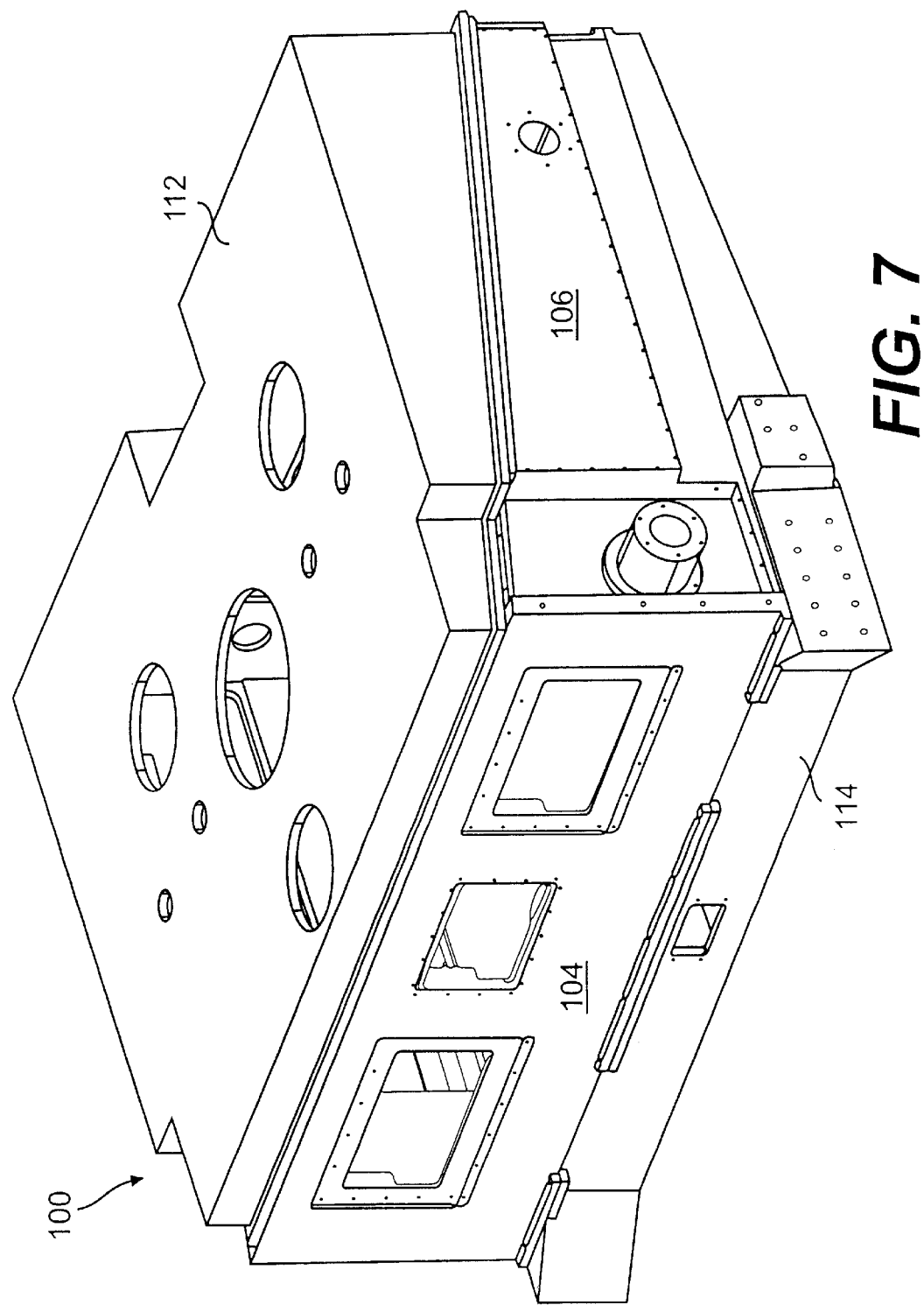
FIG. 7 is a perspective frontal view of the wafer stage chamber assembly consistent with the principles of the present invention.

FIG. 6B illustrates a partial section view of loader port 126 having a gate 131 commercially also known as a gate valve. The gate 131 functions to maintain a sealed condition within wafer stage chamber assembly 100 when semiconductor substrates 68 are not being loaded into and unloaded out of the wafer stage chamber assembly 100.

In addition, front shear panel 104 may have a window 132, shown in FIG. 1 positioned between a pair of loader ports 126. Window 132 may be used to allow an operator to view wafer stage 66 and other parts inside wafer stage chamber assembly 100. Alternatively, window 132 may be used to connect an air conditioning duct (not shown). Window 132 is also in a sealing engagement with front shear panel 104 to maintain the pressure inside wafer stage chamber assembly 100. A commercially available o-ring seal may be used.

In the illustrated embodiment, the chamber walls include a pair of side panels 106 and 108, and a rear panel 110. Each panel 106, 108, or 110 may be layered with an insulating material to isolate the sensitive and accurately aligned components inside wafer stage chamber assembly 100 from external temperature, noise, vibration, and other disturbances. The insulating material may be any types of conventional insulations, such as fiberglass. Side panels 106, 108, and rear panel 110 may be fastened to chamber frame 102 by way of welding, or bolting, or both. An o-ring seal may be provided around the perimeter of each panel 106, 108, or 110 to maintain the internal atmospheric purity of wafer stage chamber assembly 100.

Base frame 114 may include a plurality support mounting surfaces 134A, 134B, 134C, for attaching wafer stage chamber assembly 100 via a body support (not shown) to an apparatus frame 72 (shown in FIG. 8), such that wafer stage chamber assembly 100 is supported by the body supports and hangs from apparatus frame 72. In the illustrated embodiment, a pair of support mounting surfaces 134A, 134B are positioned on the front side of base frame 114 adjacent front shear panel 104, and a rear support mounting surface 134C (best shown in FIG. 2) is positioned on the rear side of base frame 114. In one embodiment, apparatus frame 72 is a part of an exposure apparatus shown in FIG. 8.

One or more of panels 106, 108, and 110 may include an access opening for connecting an internal component (not shown) of chamber assembly 100 to an external component, structure, or surface (not shown). For example, in the illustrated embodiment, one of the side panels 106, 108 has a connection port 136 for connecting a component (not shown) inside wafer stage chamber assembly 100 to apparatus frame 172 via a support member, i.e., a quick-disconnect bellows (not shown). In addition, rear panel 110 may have a damper port 138 for attaching wafer stage 66 inside chamber assembly 100 to a stationary surface, i.e., ground 82, via a damping or shock absorbing assembly (not shown).

Figure 8:
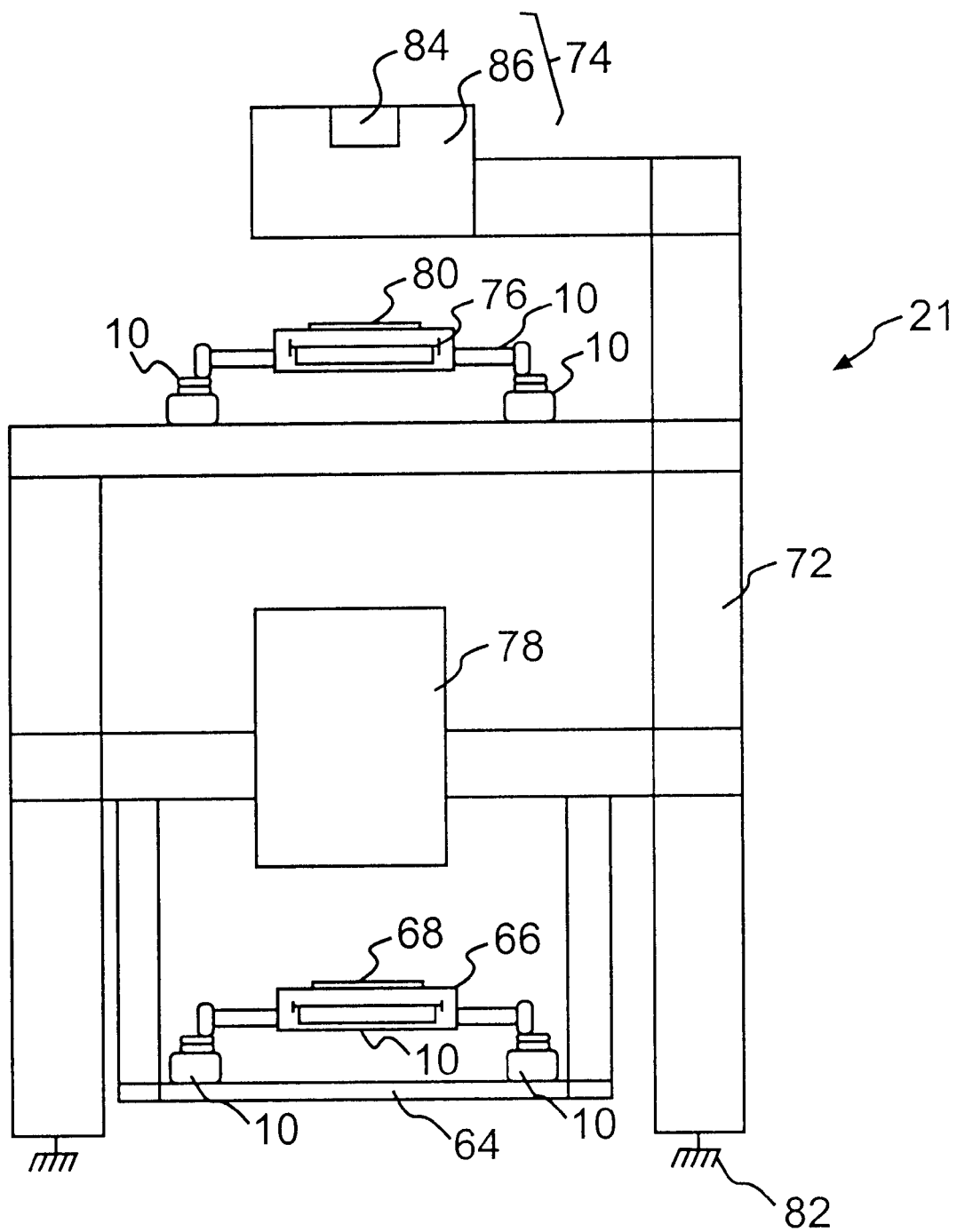
FIG. 8 is an elevation of an exposure apparatus having a wafer stage assembly.

Top wall 112 of wafer stage chamber assembly 100 has a plurality of openings for receiving components of a photolithography system, including, for example, openings 142 and 144 for motion sensors, an auto focus and auto leveling sensor (AF/AL sensor, not shown), and an opening 146 for a projection lens assembly 78 (shown in FIG. 8). Other openings 147 may also be provided to attach top wall 112 to exposure apparatus 21 shown in FIG. 8. Top wall 112 may also be layered with an insulating material to isolate wafer stage chamber assembly 100 from external temperature, noise, vibrations, and other disturbances.

Top wall 112 has a first sealing flange 122 around the perimeter thereof to interface with a top flange 148 around the perimeter of chamber frame 102. A sealing material, such as one large o-ring seal, may be provided around the perimeter of top wall 112 between first sealing flange 122 and top flange 148 to create a sealing engagement between wafer stage chamber 101 and top wall 112. Other types of chamber seal devices, such as those disclosed in U.S. Provisional Application No. 60/249,545, the entire disclosure of which is incorporated by reference, may also be used.

Base frame 114 of wafer stage chamber assembly 100 supports wafer stage chamber 101 and the internal components thereof. Base frame 114 may be made of a large metal casting. To prevent outgassing, the casting may be sealed, i.e., by filling all the voids in the casting with a sealing compound, for example, a polymer or epoxy. Generally, to manufacture a sealed metal casting base frame 114 is placed in a vacuum chamber (not shown) filled with the sealing compound, then the vacuum is turned on to draw any air bubbles out of pores in the casting and replace them with the sealing compound filling in the pores.

Similar to top wall 112, base frame 114 also has a sealing surface around the perimeter thereof to interface with bottom edges of chamber frame 102. In particular, the sealing surface may be a circumferential groove 120 to receive a sealing material, such as one large o-ring seal, provided on the bottom edges of chamber frame 102. The o-ring seal creates a sealing engagement between wafer stage chamber 101 and base frame 114.

Base frame 114 may also include a rear support mounting surface 134C (best shown in FIG. 2) on a mid-section rear side 152 for mounting wafer stage chamber 101 to apparatus frame 72 via another body support (not shown). Thus, in the illustrated embodiment, wafer stage chamber 101 is supported by apparatus frame 72 via a set of three body supports, two support mounting surfaces 134A, 134B on a front side 154, and one mounting surface 134C on the rear side 152. In addition, base frame 114 may also include a plurality of attachment ports 156 (best shown in FIG. 1) for attaching components (not shown) of wafer stage 66 to wafer stage chamber 101.

FIG. 8 illustrates a wafer stage 66 without the wafer stage chamber assembly consistent with the principles of the present invention attached to exposure apparatus 21 of a photolithography system to manufacture semiconductor wafers 68. Wafer stage carrier 66 positions the semiconductor wafer 68 as wafer stage 66 is being accelerated by a stage force (not shown) generated in response to a wafer manufacturing control system (not shown). The wafer manufacturing control system is the central computerized control system executing the wafer manufacturing process. To permit smaller and more intricate circuit pattern, projection lens assembly 78 must accurately focus the energy beam to align the overlay of circuit patterns of the multi-layered integrated circuit.

An apparatus frame 72 supports projection lens assembly 78. In operation, exposure apparatus 21 transfers a pattern of an integrated circuit from reticle 80 onto semiconductor wafer 68. Exposure apparatus 21 can be mounted to a base 82, i.e., the ground or via a vibration isolation system (not shown). Apparatus frame 72 is rigid and supports the components of exposure apparatus 21, including reticle stage 76, wafer stage 66, lens assembly 78, and illumination system 74.

Illumination system 74 includes an illumination source 84 to emit a beam of light energy. Illumination system 74 also includes an illumination optical assembly 86 to guide the beam of light energy from illumination source 84 to lens assembly 78. The beam selectively illuminates different portions of reticle 80 and exposes wafer 68.

Lens assembly 78 projects and/or focuses the light passing through reticle 80 to wafer 68. Lens assembly 78 may magnify or reduce the image illuminated on reticle 80. Lens assembly 78 may also be a 1×magnification system.

Reticle stage 76 holds and positions reticle 80 relative to lens assembly 78 and wafer 68. Similarly, wafer stage 66 holds and positions wafer 68 with respect to the projected image of the illuminated portions of reticle 80. Wafer stage 66 and reticle stage 76 are moved by a plurality of motors 10.

There are several different types of photolithography systems, including a scanning type and a step-and-repeat type. In the scanning type photolithography system, illumination system 74 exposes the pattern from reticle 80 onto wafer 68 with reticle 80 and wafer 68 moving synchronously. Reticle stage 76 moves reticle 80 on a plane which is generally perpendicular to an optical axis of lens assembly 78, while wafer stage 66 moves wafer 68 on another plane generally perpendicular to the optical axis of lens assembly 78. Scanning of reticle 80 and wafer 68 occurs while reticle 80 and wafer 68 are moving synchronously.

Alternately, in the step-and-repeat type photolithography system, illumination system 74 exposes reticle 80 while reticle 80 and wafer 68 are stationary. Wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68.

The use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application No. 873,606 (Application Date: 6–12–97) also use a reflecting-refracting type of optical system incorporating a concave mirror, etc., but without a beam splitter, and can also be employed with this invention. The disclosures in the abovementioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be released mechanically to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

This invention is not limited to use for the chamber assembly that isolates the wafer stage device from the atmospheric condition as described in the embodiments. Instead, this invention can also be used to isolate the reticle (mask) stage device 76 from the atmospheric condition. Similarly, this invention can be used to isolate the projection lens assembly 78.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 9:
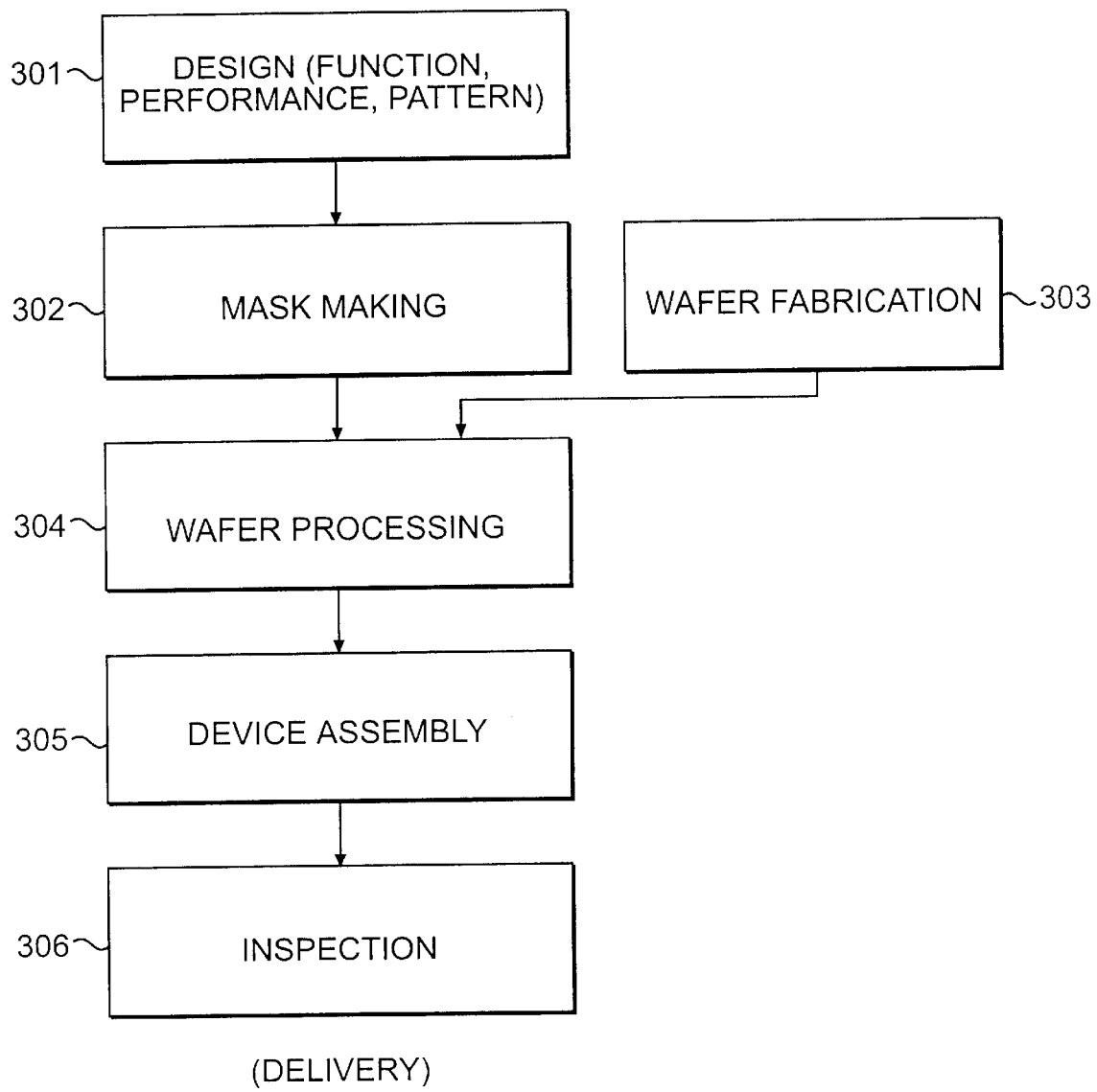
FIG. 9 is a flow chart outlining a process for manufacturing a semiconductor wafer consistent with the principles of the present invention.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 10:
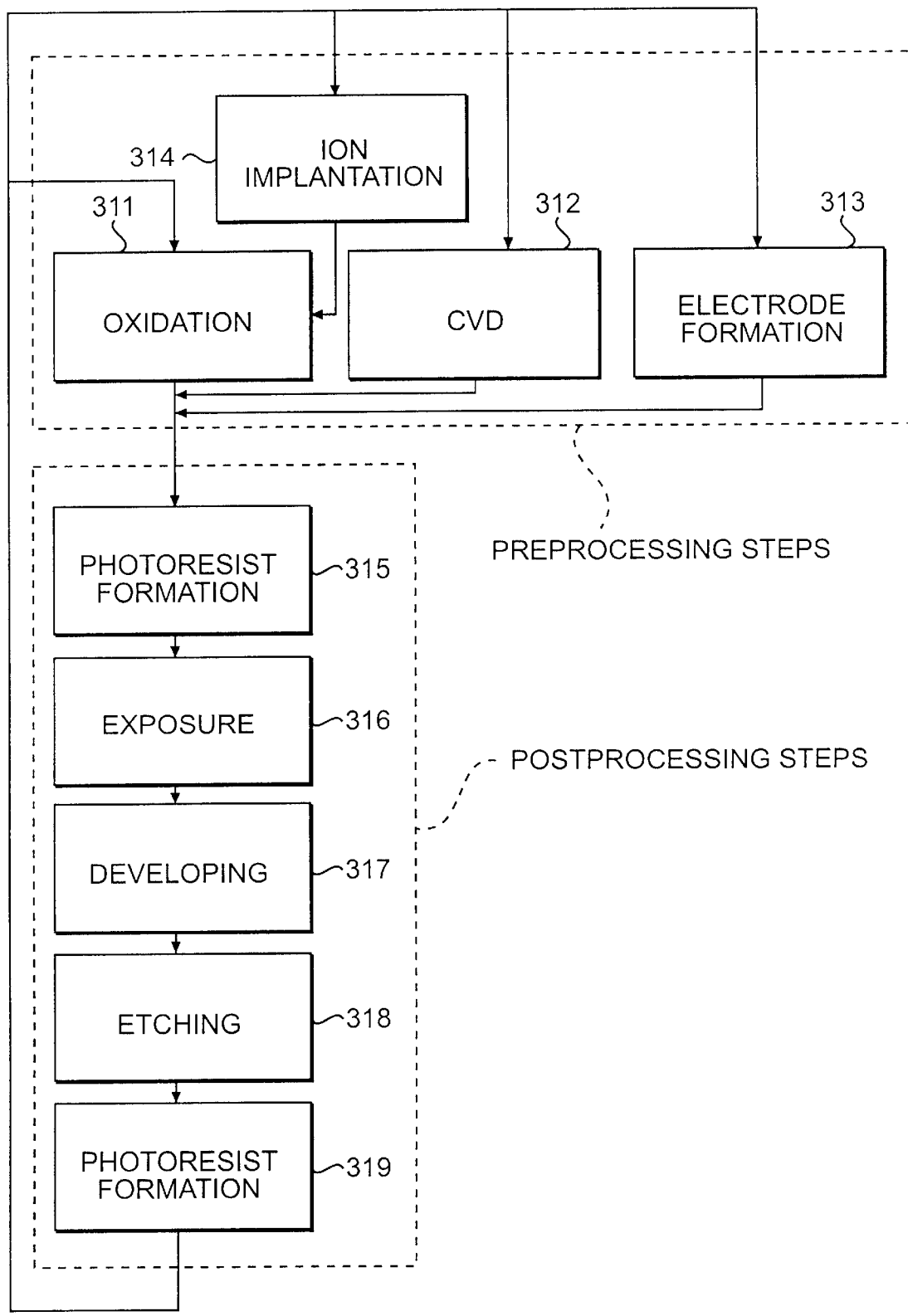
FIG. 10 is a flow chart outlining the semiconductor manufacturing process in further detail.

FIG. 10 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the wafer stage chamber assembly, the components thereof, and the methods described, the material chosen for the present invention, and in construction of the wafer stage chamber assembly, the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A detachable chamber assembly for enclosing a movable stage of a photolithography device having an apparatus frame supporting at least one of an illumination system and a projection optical assembly, the detachable chamber assembly comprising:
    a chamber enclosing the movable stage and isolating the movable stage from external conditions;
    at least one loader port in the chamber allowing passage of substrates into and out of the chamber, each loader port comprising a loader window configured to accommodate the substrates; and
    a plurality of mounting surfaces on the chamber, the plurality of mounting surfaces being detachably engaged to the apparatus frame to support the chamber.

2. The detachable chamber assembly of claim 1, wherein the at least one loader port further comprises:
    a gate that maintains a sealed condition of the chamber.

3. The detachable chamber assembly of claim 1, wherein the at least one loader port is in a sealing engagement with the chamber.

4. The detachable chamber assembly of claim 3, wherein the chamber comprises:
    a chamber frame enclosing the movable stage; and
    a plurality of chamber walls including a front panel having at least one opening corresponding to the at least one loader port through which the substrates are passed.

5. The detachable chamber assembly of claim 4, wherein at least one of the plurality of chamber walls comprises an insulation layer.

6. The detachable chamber assembly of claim 4, wherein the plurality of chamber walls further comprise:
    a top wall attached to an upper side of the chamber frame.

7. The detachable chamber assembly of claim 6, wherein the top wall is in a sealing engagement with the upper side of the chamber frame.

8. The detachable chamber assembly of claim 6, wherein the top wall comprises:
    a plurality of openings configured to sealingly engage at least one of a projection optical assembly, a plurality of sensing devices, and a fastening mechanism.

9. The detachable chamber assembly of claim 4, wherein the chamber further comprises:
    a base frame attached to a lower side of the chamber frame.

10. The detachable chamber assembly of claim 9, wherein the base frame is in a sealing engagement with the lower side of the chamber frame.

11. The detachable chamber assembly of claim 9, wherein the base frame is made of a sealed metal casting.

12. The detachable chamber assembly of claim 9, wherein the base frame further comprises:
    a plurality of attachment ports for attaching a movable stage support to the chamber.

13. The detachable chamber assembly of claim 4, wherein the front panel is a shear panel strengthening the chamber frame.

14. The detachable chamber assembly of claim 4, wherein the at least one loader port has a retaining strip attached to the front panel for retaining the loader port.

15. The detachable chamber assembly of claim 4, wherein at least one of the plurality of chamber walls comprises a damper port for connecting the movable stage to a stationary surface via a damping assembly.

16. A detachable chamber assembly for enclosing a movable stage of a photolithography device having an apparatus frame supporting at least one of an illumination system and a projection optical assembly, the detachable chamber assembly comprising:
    a chamber enclosing the movable stage and isolating the movable stage from external conditions, the chamber comprising a chamber frame, a plurality of panels, a top wall, and a base frame, wherein the panels, the top wall, and the base frame are sealed with respect to the chamber frame; and
    a plurality of mounting surfaces on the base frame, the plurality of mounting surfaces being detachably engaged to the apparatus frame to support the chamber.

17. The detachable chamber assembly of claim 16, wherein the movable stage comprises one of a wafer stage and a reticle stage.

18. The detachable chamber assembly of claim 17, wherein the movable stage comprises the wafer stage.

19. The detachable chamber assembly of claim 18, wherein the top wall comprises an opening configured to receive the projection optical assembly.

20. The detachable chamber assembly of claim 17, wherein the movable stage comprises the reticle stage.

21. The detachable chamber assembly of claim 20, wherein the top wall comprises an opening configured to receive the illumination system.

22. A photolithography system, comprising:
- an illumination system that irradiates substrates via radiant energy;
- a projection optical assembly;
- an apparatus frame that supports at least one of the illumination system and the projection optical assembly;
- a movable stage that moves relative to the projection optical assembly; and
- a detachable chamber assembly, comprising:
  - a chamber enclosing the movable stage and isolating the movable stage from external conditions;
  - at least one loader port in the chamber allowing passage of substrates into the chamber, each loader port comprising a loader window configured to accommodate the substrates; and
  - a plurality of mounting surfaces on the chamber, the plurality of mounting surfaces being detachably engaged to the apparatus frame to support the chamber.

23. A photolithography system comprising:
- an illumination system that irradiates substrates via radiant energy;
- a projection optical system;
- an apparatus frame that supports at least one of the illumination system and the projection optical assembly;
- a movable stage that moves relative to the projection optical assembly; and
- a chamber enclosing the movable stage and isolating the movable stage from external conditions, the chamber comprising a chamber frame, a plurality of panels, a top wall, and a base frame, wherein the panels, the top wall, and the base frame are sealed with respect to the chamber frame; and
- a plurality of mounting surfaces on the chamber, the plurality of mounting surfaces being detachably engaged to the apparatus frame to support the chamber.

* * * * *